United States Patent

Tanaka et al.

[11] Patent Number: 5,879,811
[45] Date of Patent: Mar. 9, 1999

[54] OXIDE THIN FILM HAVING QUARTZ CRYSTAL STRUCTURE

[75] Inventors: Motoyuki Tanaka; Takahiro Imai; Naoji Fujimori, all of Hyogo, Japan

[73] Assignee: Sumitomo Electric Industries, Ltd., Osaka, Japan

[21] Appl. No.: 502,672

[22] Filed: Jul. 14, 1995

[30] Foreign Application Priority Data

Jul. 18, 1994 [JP] Japan ................................ 6-187774
Feb. 23, 1995 [JP] Japan ................................ 7-034860
Mar. 30, 1995 [JP] Japan ................................ 7-073133

[51] Int. Cl.$^6$ ................................................... B32B 9/00
[52] U.S. Cl. ...................... 428/428; 428/446; 428/699; 428/700; 428/701; 428/702
[58] Field of Search ........................... 428/426, 428, 428/432, 699, 700, 701, 702, 446; 117/4, 7, 943; 106/481, 287.19, 286.2

[56] References Cited

U.S. PATENT DOCUMENTS

| | | | |
|---|---|---|---|
| 2,463,791 | 3/1949 | Morgan | 427/167 |
| 3,304,200 | 2/1967 | Statham | 437/238 |
| 4,152,679 | 5/1979 | Chen | 333/150 |
| 5,401,573 | 3/1995 | Babel | 428/336 |

FOREIGN PATENT DOCUMENTS

| | | |
|---|---|---|
| 0030638 | 6/1981 | European Pat. Off. . |
| 0482659 | 4/1992 | European Pat. Off. . |
| 643448 | 9/1950 | United Kingdom . |
| 793891 | 4/1958 | United Kingdom . |

OTHER PUBLICATIONS

Patent Abstracts of Japan, vol. 9, No. 254 (C–308) 11 Oct. 1985 & JP–A–60 108 325 (Nippon Denshin Denwa Kosha) 13 Jun. 1985; Abstract.

Patent Abstracts of Japan, vol. 8, No. 24 (C–208) 2 Feb. 1984 & JP–1–58 190 900 (Takashi Fujii) 7 Nov. 1983; Abstract.

Patent Abstracts of Japan, vol. 7, No. 232 (C–190) 14 Oct. 1983 & JP–A–58 125 634 (Nippon Denshin Denwa Kosha) 26 Jul. 1983; Abstract.

*Primary Examiner*—Timothy M. Speer
*Attorney, Agent, or Firm*—Sughrue, Mion, Zinn, Macpeak & Seas, PLLC

[57] ABSTRACT

An oxide thin film having a quartz crystal structure formed on a substrate, the oxide thin film being composed of a single layer or a plurality of layers having a thickness of 5 nm to 50 μm per layer, each of the layer comprising silicon dioxide, germanium dioxide, or a mixture thereof.

5 Claims, 3 Drawing Sheets

OXIDE THIN FILM HAVING QUARTZ CRYSTAL STRUCTURE

FIELD OF THE INVENTION

The present invention relates to an oxide crystal thin film having a quartz crystal structure which is useful in an oscillator, a vibrator, a surface acoustic wave device for radiofrequency filters, an optical waveguide, a semiconductor substrate, etc. and a process for producing the same.

BACKGROUND OF THE INVENTION

Quartz crystal is widely used in an oscillator, a surface acoustic wave device for radiofrequency filters, an optical waveguide, a semiconductor substrate, etc. and is a very important material in industry.

Crystal modifications of silicon dioxide ($SiO_2$) include quartz ($\leq 867°$ C.), tridymite ($867°$ to $1,470°$ C.), and cristobalite ($1,470°$ to $1,723°$ C.). When these crystals are synthesized in practice, they are not always synthesized in an equilibrium state because of involvement of various factors such as impurities and temperature control, so that the above-described relationship between crystal structure and temperature does not always apply.

Quartz is a low-temperature phase ($\leq 870°$ C.) of silicon dioxide crystals. However, since silicon dioxide has a melting point of $1,730°$ C., which is far higher than the low-temperature phase transition point, $867°$ C., it is deemed that solidification of molten silicon dioxide results in a glassy state or a crystal structure other than quartz, e.g., cristobalite which is stable around the melting point. Thus, it is considered that growth of quartz cannot be achieved by a simple high temperature treatment, and growth in low temperatures around the transition point be essential.

Aiming at growth of quartz in low temperatures below the transition point, quartz has conventionally been produced by a hydrothermal process in which crystal is produced from an aqueous solution under high temperature and high pressure conditions in a sealed container, particularly by a hydrothermal temperature differential process utilizing difference in temperature-dependent solubility of silicon dioxide in an alkali solution, in which a single crystal of quartz is made to grow on a seed crystal from an alkali solution of silicon dioxide by making a temperature difference under high temperature and high pressure conditions. The process for producing quartz by the hydrothermal temperature differential process is described, e.g., in *Ceramics*, vol. 15, 170–175 (1980).

However, the conventional hydrothermal temperature differential process requires large-scaled equipment, and cost saving cannot be afforded without using a huge apparatus and producing a large single crystal. Furthermore, the process only produces lumpy large crystals or particulate powder and cannot be applied as such to the formation of quartz single crystals having an arbitrary shape, such as a thin film. Therefore, quartz for actual use as an oscillator, a vibrator, a surface acoustic wave device for radiofrequency filters, etc. has been mass-produced by slicing a large-sized single quartz crystal produced by the hydrothermal temperature differential process.

With the recent heightening of telecommunication frequency, quartz having a further reduced thickness has been demanded for use as an oscillator, a vibrator or a filter. However, the thinness achieved by slicing of a large single crystal is limited, with the smallest thickness so far reached is 50 $\mu$m in practice.

Further, in order to meet the above demand, a method for abrading quartz adhered on a semiconductor substrate into a thin film has been proposed as disclosed in JP-A-5-327383 (the term "JP-A" means an "unexamined published Japanese patent application"). Nevertheless, thickness reduction by abrasion is limited and incurs extra cost.

SUMMARY OF THE INVENTION

An object of the present invention is to provide a thin film comprising an oxide polycrystal or single crystal having a quartz crystal structure with arbitrary thickness and shape suitable for use as an oscillator, etc.

Another object of the present invention is to provide a process for producing such an oxide thin film at low cost without requiring large-scaled equipment as in a conventional hydrothermal process.

Other objects and effects of the present invention will be apparent from the following description.

The present inventors have found that an oxide thin film having a quartz crystal structure with arbitrary shape and thickness can be synthesized at low cost by a sol-gel process or vapor phase deposition in which a trace amount of an alkali metal is added to the raw material or the temperature condition is property controlled.

The present invention relates to an oxide thin film having a quartz crystal structure formed on a substrate, the oxide thin film being composed of a single layer or a plurality of layers having a thickness of 5 nm to 50 $\mu$m per layer, each of the layer comprising silicon dioxide, germanium dioxide, or a mixture thereof.

In a preferred embodiment, the oxide thin film is an oxide single crystal film having a quartz crystal structure, composed of a single layer or a plurality of layers having a thickness of 5 nm to 50 $\mu$m per layer, and formed on a single crystal substrate by epitaxial growth, each of the layer comprising silicon dioxide, germanium dioxide, or a mixture thereof.

The present invention also relates to a process for producing an oxide thin film having a quartz crystal structure comprising the steps of:

coating a substrate with a precursor solution for a sol-gel process prepared from a metal-containing solution containing at least one of silicon, germanium, and compounds thereof and heating the coating layer at a temperature of 500° to 1,200° C. to crystallize an oxide thin film having a quartz crystal structure comprising silicon dioxide, germanium dioxide, or a mixture thereof from the precursor solution on the substrate.

In a preferred embodiment of the above-mentioned sol-gel process, the substrate is a single crystal substrate.

The present invention further relates to another process for producing an oxide thin film having a quartz crystal structure comprising the step of depositing at least one layer of an oxide having a quartz crystal structure on a substrate kept at a temperature of 400° to 1,200° C. by vapor phase deposition using a raw material containing at least one of silicon and germanium. The raw material preferably contains at least one of silicon and germanium, and at least one of an alkali metal.

DETAILED DESCRIPTION OF THE INVENTION

Compounds having a quartz crystal structure and exhibiting useful characteristics such as piezoelectric properties include silicon dioxide ($SiO_2$), germanium dioxide ($GeO_2$), and an oxide having a mixed composition thereof. Accordingly, the oxide film of the present invention mainly comprises silicon dioxide and/or germanium dioxide. For obtaining excellent characteristics, it is preferable that the total content of silicon and germanium in the oxide film is at least 70 mol %, still preferably 90 mol % or more, based on the total amount of metals contained in the oxide film. If the total content of silicon and germanium is less than 70 mol %, the quartz crystal structure is so weak that the characteristics of the oxide may be deteriorated.

It is known that silicon dioxide takes a variety of crystal structures inclusive of a quartz crystal structure, i.e., a tridymite structure, a cristobalite structure, a stishovite structure, and a coesite structure. These oxides are very stable in a glassy state, i.e., an amorphous state having no crystal structure. Therefore, it is important for the production of an oxide having an industrially useful quartz crystal structure that a crystal structure other than a quartz crystal structure or a glass component should not be incorporated into the production system.

Silicon dioxide has as a high melting point as 1,730° C. while the stable region for a quartz crystal structure is as low as 870° C. A mere temperature rise results in a failure of crystallization or in the formation of a different high-temperature phase crystal structure, and it is difficult to obtain a pure quartz crystal structure. According to the aforesaid hydrothermal process, quartz is obtained by crystallization from an alkaline aqueous solution of silicon dioxide at around 350° C. and 1,000 atm in a high-pressure container. Thus, it has been difficult to synthesize silicon dioxide having a quartz crystal structure by a sol-gel process including calcination in atmospheric pressure or vapor phase deposition under reduced pressure. It has now been ascertained that a quartz crystal structure can be stably obtained in a sol-gel process or vapor phase deposition by addition of an alkali metal to a raw material and/or mixing of germanium dioxide with a raw material.

Addition of an alkali metal such as lithium, sodium or potassium is effective to accelerate crystallization of silicon dioxide into a quartz crystal structure and to broaden the temperature region in which a quartz crystal structure exists stably. Addition of a trace amount of an alkali metal to a metal-containing solution makes it easy to stabilize an oxide single crystal having a quartz crystal structure. While it is effective to add an alkali metal to silicon dioxide for formation of a quartz crystal structure, the amount of the alkali metal to be added is preferably minimized. If it is too large, an oxide having different crystal structure may be precipitated, or the characteristics essential to the oxide having a quartz crystal structure, such as dielectric characteristics, piezoelectric characteristics and temperature stability, may be impaired.

A preferred content of the alkali metal in an oxide thin film ranges from $3 \times 10^{-4}$ to 10 mol % based on the total metal content. If the alkali metal content exceeds 10 mol % based on the total metal content, deterioration of the characteristics becomes serious. If it is less than $3 \times 10^{-4}$ mol %, the effect on stabilization of the quartz crystal structure is lessened. A still preferred alkali metal content is from $5 \times 10^{-2}$ to 2 mol % based on the total metal content.

The alkali metal to be added can be selected from lithium, sodium, potassium, rubidium, cesium, and a mixture thereof. Lithium is the most effective on stabilization of a quartz crystal structure. Further, since lithium has the smallest atomic radius of all alkali metals, it has the least influence on the characteristics of an oxide having a quartz crystal structure. Furthermore, when a high voltage is applied to the resulting oxide to diffuse and remove the alkali metal ion (electrolytic diffusion), the treatment is more effective on lithium than on other alkali elements. Accordingly, lithium is the most preferred of the alkali metals.

Germanium dioxide has as a low melting point as about 1100° C. and a broad temperature range for a stable quartz crystal structure. Therefore, germanium dioxide having a quartz crystal structure can be stable with no addition of an alkali metal. For this reason, the effect of the addition of the alkali metal is particularly noticeable when the oxide mainly comprises silicon dioxide. Accordingly, when an alkali metal is added, the silicon content in the oxide is preferably at least 70 mol %, still preferably 90 mol % or more, based on the total metal content in the oxide.

For the same reason as above, an oxide mainly containing a mixture of silicon dioxide and germanium dioxide is easy to crystallize into a quartz crystal structure. A preferred molar ratio of germanium to silicon in the oxide is from 0.01 to 4. If the molar ratio is less than 0.01, the effect on stabilization of a quartz crystal structure may be insubstantial. If it exceeds 4, the resulting mixed oxide appreciably shows the water solubility attributed to germanium dioxide and is impractical for use as an industrial device material. A still preferred molar ratio of germanium to silicon is from 0.2 to 1.5.

In order to improve dielectric characteristics, piezoelectric characteristics, semiconductor characteristics, and the like, the oxide thin film having a quartz crystal structure may contain various elements as impurities, such as beryllium, boron, carbon, magnesium, aluminum, phosphorus, calcium, and titanium, in addition to the above-described silicon, germanium, and alkali metal.

The oxide film having a quartz crystal structure may have a single layer structure or a multi-layer structure. In order to obtain a film having uniform and stable characteristics, each layer should have a thickness of at least 5 nm. Since too large thickness tends to cause thermal stress, surface roughening and reduction of crystal properties, the upper limit for obtaining stable characteristics is 50 μm per layer.

In general, piezoelectric characteristics and the like characteristics of an oxide having a quartz crystal structure are attributed to its crystal structure. It is necessary therefore that the oxide film of the present invention is generally a single crystal or a polycrystal having a crystal orientation in order that it can fully display its characteristics for use as a vibrator, etc.

Such an oxide film comprising a single crystal or a polycrystal having a crystal orientation can be obtained by using a single crystal as a substrate on which an oxide film is to be formed. The crystal structure of the substrate is reflected on that of the thin film formed thereon through the interfacial bonding between the substrate and the thin film. That is, use of a single crystal substrate makes it possible to form a single-layered or multi-layered oxide film in which the layer in direct contact with the substrate is a single crystal with each of the other layers being a single crystal or having a crystal orientation.

The single crystal substrate to be used is preferably a single crystal of an oxide, such as quartz, sapphire, magnesium oxide, or strontium titanate. The most preferred of them is quartz because both a crystal structure and a lattice constance of quartz are in substantial agreement with those of the oxide thin film growing thereon, and quartz is easily available. Any crystal orientation of quartz may serve as a substrate surface. From the standpoint of temperature stability of oscillation frequency, the AT plane (JIS C6704-1992) is preferably used as a substrate.

The oxide crystal thin film is sometimes composed of crystal grains depending on the film forming method and conditions. In these cases, the crystal grain size is preferably not more than 500 nm so as not to impair the characteristics of the crystal film. If the crystal grain size exceeds 500 nm, there may be large gaps among grains, failing to provide a dense crystal film having satisfactory characteristics.

The sol-gel process which can be adopted for the production of an oxide thin film having a quartz crystal structure according to the present invention will be explained below.

A solvent-soluble compound of silicon and/or germanium, such as an alkoxide, is diluted with a solvent, such as an alcohol, to prepare a metal-containing solution. If necessary, an alkali metal compound, water, an amine, etc. may be added thereto, and the solution may refluxed. The thus prepared precursor solution is applied to a substrate by spin coating or dip coating. The substrate coated with the precursor solution is heat-treated to evaporate the solvent, etc., whereby the coating layer sets to gel, solidifies, and crystallizes.

The sol-gel process is advantageous in that a solution type precursor can easily provide a thin film of any desired shape on a substrate by coating. The film thickness can be controlled by properly setting the viscosity of the precursor solution and the film formation conditions such as the spinning rate in spin coating or the pulling speed in dip coating. The film formation can be repeatedly carried out to reach a desired thickness. A plurality of layers different in composition may be built up by changing the composition of the precursor solution.

The heat-treatment should be carried out at a temperature at which the precursor crystallizes into a quartz crystal structure, e.g., a temperature ranging from 500° to 1,200° C., while varying depending on the amount of an alkali metal added. More specifically, a preferred heating temperature is from 800° to 1,200° C. for formation of a silicon dioxide thin film and from 500° to 1,000° C. for formation of a germanium dioxide thin film. For a mixed oxide, a preferred temperature range is from 500° to 1,200° C., broader than that for each oxide alone. In this case, when the silicon dioxide content becomes higher, the heating temperature is preferably made higher. If the heating temperature is lower than 500° C., no crystallization occurs or, if it does, the resulting crystal has poor crystal properties and tends to contain organic groups originated in the raw material. If the temperature exceeds 1,200° C., high-temperature phase crystals of different crystal structure tend to be formed. Accordingly, the heat treatment is conducted at a temperature ranging from 500° to 1,200° C. It is preferable to conduct the heat treatment in an oxygen atmosphere or a steam-containing oxygen atmosphere, or in the air or steam-containing air.

Examples of the metal compounds which can be used as raw material in the sol-gel process include metal alkoxides, e.g., $Si(OCH_3)_4$, $Si(OC_2H_5)_4$, $Si(OC_3H_7)_4$, $Ge(OCH_3)_4$, $Ge(OC_2H_5)_4$, and $Ge(OiC_3H_7)_4$; metal acetylacetates, e.g., $Si(COCH_2COCH_3)_4$; metal hydroxides, e.g., $Si(OH)_4$; and metal halides, e.g., $SiCl_4$. The alkali metal, if used, can be added as, for example, $LiOC_2H_5$, $NaOC_2H_5$, $LiCOCH_2COCH_3$, $LiOH$, or $LiCl$.

Upon solidifying in the sol-gel process, it is required to control the gelation process of a precursor solution. If gelation is insufficient, cases are often met with where the raw material is evaporated during the heat treatment. If gelation proceeds excessively, large gelatinous bodies gather, making gaps among themselves or making difference in crystal properties, and thus making it difficult to form a dense and good quality crystal film. There are cases in which a raw material in a metal-containing solution suffers no evaporation during heat treatment because of the kind of the raw material or the heating condition, or cases in which a metal-containing solution as prepared has already gelled to a moderate degree. In these cases, the metal-containing solution can be used as such as a precursor solution.

The gelation control can be effected by refluxing the metal-containing solution or by adding various additives such as water to the solution.

On addition of water, the metal compound in the metal-containing solution is hydrolyzed to form a highly active metal hydroxide, which, on polycondensation, accelerates gelation. While varying depending on the combination with other additives, a preferred amount of water to be added for moderate gelation is from 0.2 to 20 molar equivalents per mole of the total metal elements content in the metal-containing solution. If the amount of water is less than 0.2 molar equivalent, acceleration of gelation is insufficient so that the raw material would be evaporated at the time of heat treatment, making formation of a dense film difficult. If it exceeds 20 molar equivalents, gelation will proceed excessively, making it difficult to apply the precursor solution to the substrate uniformly.

Examples of the additives for suppressing gelation include diethanolamine, diisopropanolamine, triethanolamine, and diethylene glycol. These additives undergo substitution reaction with a metal compound to lessen the activity of the metal compound thereby serving to stabilize the precursor solution. Addition of these additives suppresses excessive progress of gelation and stabilizes the precursor solution against change with time. While varying depending on the combination with other additives, a preferred amount of these additives to be added is from 0.5 to 6 molar equivalents per mole of the total content of metal elements in the metal-containing solution. If the amount of the amine additive is less than 0.5 molar equivalent, there is produced little effect of suppressing excessive progress of gelation. If it exceeds 6 molar equivalents, no appreciable enhancement of the effect on excessive progress of gelation results, and impurities such as carbon and nitrogen tend to remain in the thin film formed.

In order to obtain the highest effect of adding additives, such as an alkali metal, water, diethanolamine, etc., it is preferable to use a combination of these additives.

Vapor phase deposition which is another method for producing an oxide thin film having a quartz crystal structure is explained below.

Examples of techniques of vapor phase deposition include a chemical vapor deposition (CVD) process, a sputtering process, a vacuum evaporation process, and a laser ablation process. In any of the techniques, an oxide film having a quartz crystal structure can be formed on a substrate by using a raw material containing silicon and/or germanium and, if necessary, further containing at least one of alkali metals with controlling the temperature of the substrate.

The substrate temperature, while varying depending on the amount of alkali metals added, is selected from the range of from 400° to 1,200° C. More specifically, the substrate temperature preferably ranges from 600° to 1,200° C. for the formation of a silicon dioxide film and from 400° to 1,000° C. for the formation of a germanium dioxide film. For a mixed oxide, a preferred temperature range is from 400° to 1200° C., broader than that for each oxide alone. In this case, when the silicon dioxide content becomes higher, the substrate temperature is preferably made higher.

The raw material to be used in the CVD process is a vaporizable compound containing silicon and/or germanium. Examples of suitable compounds include metal alkoxides, e.g., $Si(OCH_3)_4$, $Si(OC_2H_5)_4$, $Si(OC_3H_7)_4$, $Ge(OCH_3)_4$, $Ge(OC_2H_5)_4$, and $Ge(OC_3H_7)_4$; organometallic compounds, e.g., $Si(CH_3)_4$ and $SiH_4$; and metal halides, e.g., $SiH_2Cl_2$, $SiCl_4$, and $GeCl_4$. The alkali metal, if used, can be added as, for example, $LiOC_2H_5$ and $NaOC_2H_5$.

In a CVD process, the metal-containing raw material gas must be mixed with oxidizing gas, such as oxygen, carbon dioxide, nitrous oxide, or steam. The mixed gas is diluted with a diluent gas, such as hydrogen, an inert gas or nitrogen, and led to the surface of a heated substrate in a deposition chamber. The pressure in the chamber is preferably from 0.01 Torr to atmospheric pressure. If the pressure is less than 0.01 Torr, the crystal growth is too slow for practical use. A CVD process under a pressure exceeding atmospheric pressure requires a very expensive system. In order to accelerate decomposition of the starting mixed gas, a plasma enhanced CVD process or a photo assisted CVD process is effective.

In the sputtering process, metallic silicon and/or germanium or an oxide having a desired composition is used as a target. In the case of an oxide target, an inert gas, such as Ar, He or Ne, is used as sputtering gas. In the case of a metal target, a mixed gas of the inert gas and an oxygen-containing gas, such as $O_2$, $N_2O$ or $CO_2$, is used as sputtering gas. The pressure of the deposition chamber is preferably not more than 10 Torr. Ions can be generated within the pressure range of from 0.0001 to 10 Torr. Examples of ion generation systems by voltage application include a DC diode system, an RF diode system, and an ion beam system, and any of them can be used in the present invention.

In the vacuum evaporation process, an oxide film is formed by heat-evaporating a raw material at a high degree of vacuum, e.g., under a pressure of not more than 10 Torr, preferably not more than 0.01 Torr. Oxide raw materials, such as $SiO_2$, $SiO$, $GeO_2$, and $Li_2O$, are preferably used. In using a metallic raw material, oxygen or an oxygen-containing gas must be separately introduced into the deposition chamber. Modified vacuum evaporation techniques, such an MBE process, an ion plating process, an activated reaction evaporation process, and an arc ion plating process, may also be used in the present invention.

The laser ablation process is a method in which pulse or continuous focused laser beam is applied to a minute portion of a raw material to evaporate instantaneously. This technique is excellent in composition controllability, that is, the composition of the formed film is substantially the same as that of the raw material and is thus suitable to the process of the present invention. Therefore, an oxide having a fixed composition is preferably used as a raw material. Preferred examples of lasers include those having a short wavelength and capable of offering high energy density, such as an excimer laser (ArF, KrF, KrCl, XeCl) and a YAG laser. In order to maintain the denseness of the oxide film, the pressure in the chamber must be 10 Torr or lower.

The present invention will now be illustrated in greater detail with reference to Examples, but it should be understood that the present invention is not limited thereto. Unless otherwise indicated, all the percents are given by weight.

EXAMPLE 1

A silicon dioxide thin film was formed on a quartz glass substrate by a sol-gel process using a metal alkoxide raw material.

A quartz glass substrate having been mirror polished was retreated by subjecting to ultrasonic cleaning in acetone dipping in 20% hydrochloric acid, washing with pure water, and drying.

Separately, 10.417 g of $Si(OC_2H_5)_4$ was dissolved in 100 ml of ethanol to prepare a 0.5 mol/l ethanol solution containing silicon. To the solution were added 2.7 g of water, 5.257 g of diethanolamine, and 0.026 g of $LiOC_2H_5$ to prepare a precursor solution for the sol-gel process.

The precursor solution was applied on the retreated quartz glass substrate by spin coating at 2,000 rpm, heated in a steam-containing oxygen atmosphere up to 900° C. at a rate of temperature increase of 10° C./min, and kept at that temperature for 2 hours to form a thin film.

In order to evaluate crystal properties of the resulting thin film, the film on the substrate was analyzed by X-ray diffractometry by a θ–2θ method. The diffraction pattern showed only an amorphous peak at around 20° due to the quartz glass substrate and a peak assigned to a polycrystalline quartz of the thin film, revealing the formation of a polycrystalline silicon dioxide film having a quartz crystal structure.

COMPARATIVE EXAMPLE 1

Pretreatment of a substrate, preparation of a precursor solution, and formation of a thin film were carried out in the same manner as in Example 1, except that water was not added in the preparation of a precursor solution. After the heat treatment, no dense thin film was formed.

COMPARATIVE EXAMPLE 2

Pretreatment of a substrate, preparation of a precursor solution, and formation of a thin film were carried out in the same manner as in Example 1, except for changing the amount of water added for the preparation of a precursor solution to 25 g. The precursor solution could not uniformly applied to the substrate, failing to provide a uniform thin film.

EXAMPLE 2

Pretreatment of a substrate, preparation of a precursor solution, and formation of a thin film were carried out in the same manner as in Example 1, except for using the AT plane (JIS C6704-1992) of a mirror quartz single crystal as a substrate. The thin film formed on the quartz single crystal substrate was analyzed by X-ray diffractometry in the same manner as in Example 1. As a result, no amorphous component was observed at a low angle ($\leq 20°$), and no peak except for the AT surface of quartz was observed, revealing the formation of a quartz single crystal thin film. The film had a thickness of 80 nm and contained 1 mol % of lithium based on the total metal content.

COMPARATIVE EXAMPLE 3

Pretreatment of a substrate, preparation of a precursor solution, and formation of a thin film were carried out in the same manner as in Example 2, except for changing the heating temperature for film formation to 350° C. As a result of X-ray diffractometry of the thin film formed on the quartz single crystal substrate, an amorphous peak (at around 20°) and a peak assigned to the AT surface of the quartz substrate were observed, revealing the formation an amorphous $SiO_2$ thin film.

COMPARATIVE EXAMPLE 4

Pretreatment of a substrate, preparation of a precursor solution, and formation of a thin film were carried out in the same manner as in Example 2, except for changing the heating temperature for film formation to 1,250° C. As a result of X-ray diffractometry of the thin film formed on the quartz single crystal substrate, a peak assigned to a cristobalite structure and a peak assigned to the AT surface of the quartz substrate were observed, revealing the formation a thin film having a cristobalite structure, a high-temperature phase of $SiO_2$.

COMPARATIVE EXAMPLE 5

Pretreatment of a substrate, preparation of a precursor solution, and formation of a thin film were carried out in the same manner as in Example 2, except for adding no $LiO_2H_5$ in the preparation of a precursor solution. As a result of X-ray diffractometry of the thin film formed on the quartz single crystal substrate, an amorphous peak (at around 20°) and a peak assigned to the AT plane of the quartz substrate were observed, revealing the formation of an amorphous $SiO_2$ thin film.

COMPARATIVE EXAMPLE 6

Pretreatment of a substrate, preparation of a precursor solution, and formation of a thin film were carried out in the same manner as in Example 2, except for changing the amount of $LiO_2H_5$ to 0.52 g. As a result of X-ray diffractometry of the thin film formed on the quartz single crystal substrate, a peak assigned to the AT plane of the quartz substrate and a peak of $Li_2Si_2O_5$ were observed, indicating that the film contained $Li_2Si_2O_5$.

EXAMPLE 3

A germanium dioxide thin film was formed on a quartz single crystal substrate by a sol-gel process using a metal alkoxide raw material.

The (001) plane (Z plane) of a quartz single crystal having been mirror polished was used as a substrate. The substrate was retreated by subjecting to ultrasonic cleaning in acetone, dipping in 20% hydrochloric acid, washing with pure water, and drying.

Separately, 12.65 g of $Ge(OC_2H_5)_4$ was dissolved in 100 ml of ethanol to prepare a 0.5 mol/l ethanol solution containing germanium. To the solution was added 0.5 g of water to prepare a precursor solution for the sol-gel process.

The precursor solution was applied on the retreated quartz substrate by spin coating at 2,000 rpm, heated in the air at a rate of temperature increase of 10° C./min up to 500° C., and kept at that temperature for 2 hours.

Figure 1:
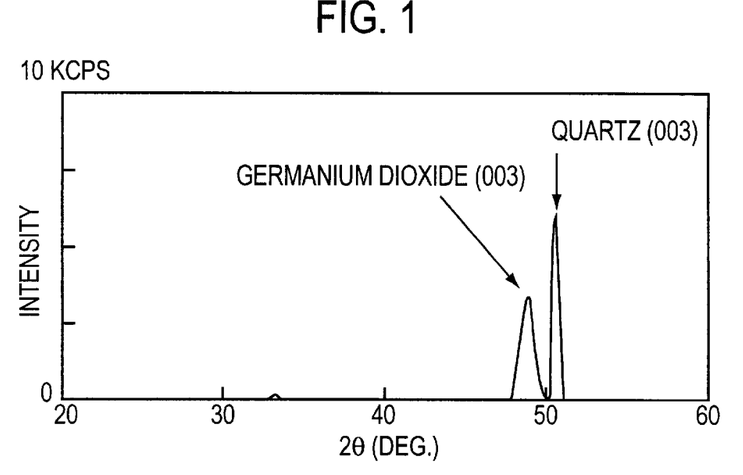
FIG. 1 is an X-ray diffraction pattern of the quartz single crystal substrate (Z plane) and the germanium dioxide thin film formed thereon in Example 3.

The thin film formed on the quartz single crystal substrate was analyzed by X-ray diffractometry in the same manner as in Example 1. The results are shown in FIG. 1. The diffraction pattern showed a peak assigned to the Z plane of germanium dioxide having a quartz crystal structure and a peak assigned to the Z plane of the quartz single crystal substrate, with no peak of an amorphous component at a low angle ($\leq 20°$).

Figure 2:
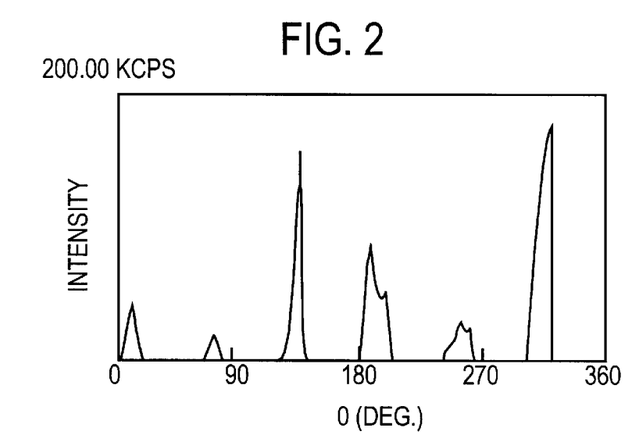
FIG. 2 is an X-ray diffraction pattern of the (104) plane of the quartz substrate in Example 3, with the Z-axis as an axis of rotation.
Figure 3:
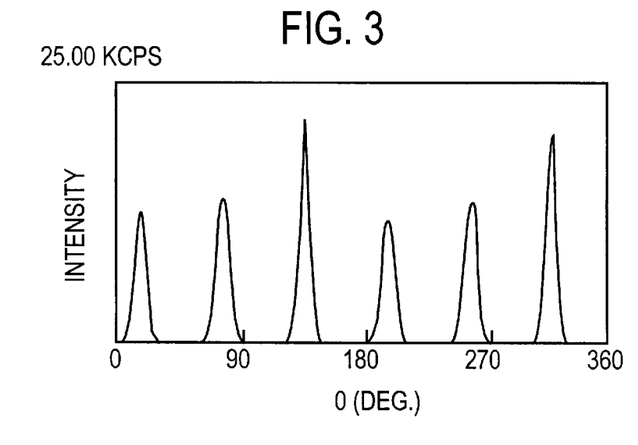
FIG. 3 is an X-ray diffraction pattern of the (104) plane of the germanium dioxide thin film having a quartz crystal structure in Example 3, with the Z-axis as an axis of rotation.

Further, diffraction of the (104) plane of germanium dioxide having a quartz crystal structure and the (104) plane of the quartz single crystal substrate was observed by a rotating crystal method with the Z-axis as an axis of rotation. As shown in FIGS. 2 and 3, from the fact that germanium dioxide having a quartz crystal structure showed diffraction at the same angles as those of the diffraction of the quartz single crystal substrate, it was revealed that a germanium dioxide single crystal thin film having a quartz crystal structure had been formed. The germanium dioxide single crystal thin film having a quartz crystal structure had a thickness of 65 nm.

EXAMPLE 4

A silicon dioxide/germanium dioxide mixture thin film was formed on a quartz single crystal substrate by a sol-gel process using metal alkoxides as a raw material.

The (110) plane (X plane) of a quartz single crystal having been mirror polished was used as a substrate. The substrate was retreated by subjecting to ultrasonic cleaning in acetone, dipping in 20% hydrochloric acid, washing with pure water, and drying.

Separately, 6.32 g of $Ge(OC_2H_5)_4$ and 3.806 g of $Si(OCH_3)_4$ were dissolved in 100 ml of ethanol to prepare an ethanol solution containing 0.25 mol/l of silicon and 0.25 mol/l of germanium. To the solution was added 9 g of water to prepare a precursor solution for the sol-gel process.

The precursor solution was applied on the retreated quartz substrate by spin coating at 2,000 rpm, heated in an oxygen atmosphere at a rate of temperature increase of 10° C./min up to 1,000° C., and kept at that temperature for 2 hours.

The thin film formed on the substrate was analyzed by X-ray diffractometry in the same manner as in Example 1. The diffraction pattern exhibited a peak assigned to the X plane of a mixture having a quartz crystal structure and a peak assigned to the X plane of the quartz single crystal substrate with no peak of an amorphous component at a low angle ($\leq 20°$).

Further, diffraction of the (211) plane of the mixture having a quartz crystal structure and the (211) plane of the quartz single crystal substrate was observed by a rotating crystal method with the X-axis as an axis of rotation. As a result, the mixture having a quartz crystal structure showed diffraction at the same angles as those of the diffraction of the quartz single crystal substrate. It was thus revealed that a single crystal thin film of a mixture of silicon dioxide and germanium dioxide having a quartz crystal structure had been formed. The single crystal thin film of the mixed oxide having a quartz crystal structure had a thickness of 70 nm. As a results of electron X-ray fluorometry, the film was found to have an Si/Ge ratio of 1/1.01. Observation of the mixed oxide single crystal thin film under a transmission electron microscope revealed a crystal structure having a crystal grain size of 20 nm.

11

EXAMPLE 5

A thin film composed of a silicon dioxide/germanium dioxide mixture layer and a germanium dioxide layer was formed on a 10 mm-square quartz single crystal substrate by a sol-gel process using metal alkoxides as a raw material.

The (001) plane (Z plane) of a quartz single crystal having been mirror polished was used as a substrate. The substrate was retreated by subjecting to ultrasonic cleaning in acetone, dipping in 20% hydrochloric acid, washing with pure water, and drying.

Separately, 6.32 g of $Ge(OC_2H_5)_4$ and 3.806 g of $Si(OCH_3)_4$ were dissolved in 100 ml of ethanol to prepare an ethanol solution containing 0.25 mol/l of silicon and 0.25 mol/l of germanium. To the solution was added 9 g of water to prepare a precursor solution for the sol-gel process (hereinafter referred to as precursor solution 1). In another 100 ml of ethanol was dissolved 12.65 g of $Ge(OC_2H_5)_4$ to prepare a 0.5 mol/l ethanol solution of germanium. To the solution was added 0.5 g of water to prepare a precursor solution for the sol-gel process (hereinafter referred to as precursor solution 2).

Precursor solution 1 was applied to the retreated quartz substrate by spin coating at 2,000 rpm and heated at 300° C. for 10 minutes. The above coating and drying steps were repeated 20 times. Thereafter, the coating layer was heated in an oxygen atmosphere up to 1,000° C. at a rate of temperature increase of 10° C./min, and kept at that temperature for 2 hours.

Precursor solution 2 was applied on the thus formed silicone dioxide/germanium dioxide mixture thin film by spin coating at 2,000 rpm and dried at 300° C. for 10 minutes. The above coating and drying steps were repeated 20 times. The coating layer was heated to 500° C. in an oxygen atmosphere at a rate of temperature increase of 10° C./min, and kept at that temperature for 2 hours.

Figure 4:
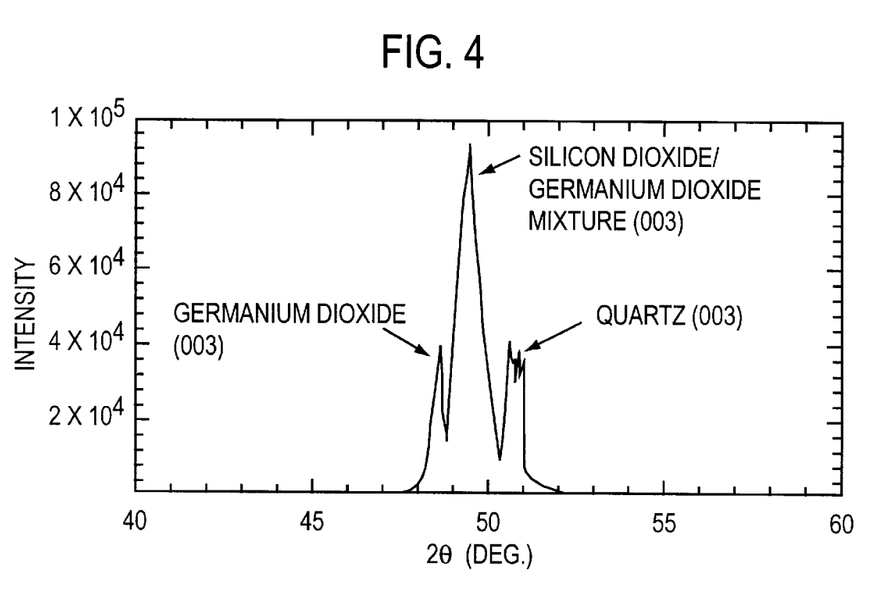
FIG. 4 is an X-ray diffraction pattern in Example 5 showing the peaks of the quartz single crystal substrate (Z plane), the silicon dioxide/germanium dioxide mixture layer formed on the substrate, and the germanium dioxide layer formed on the dioxide mixture layer.

The thin film formed on the substrate had the same shape as the substrate (10 mm-square). The thin film was analyzed by X-ray diffractometry in the same manner as in Example 1. As shown in FIG. 4, the diffraction pattern had peaks assigned to the Z plane each of the quartz substrate, a silicon dioxide/germanium dioxide mixture having a quartz crystal structure, and germanium dioxide having a quartz crystal structure. It was revealed that a single crystal thin film composed of a mixture of silicon dioxide and germanium dioxide having a quartz crystal structure and a single crystal thin film of germanium dioxide having a quartz crystal structure had been formed on the substrate. The mixed single crystal layer and the germanium dioxide single crystal layer had a thickness of 1.4 $\mu$m and 1.3 $\mu$m, respectively. As a results of electron X-ray fluorometry, the film was found to have an Si/Ge ratio of 1/1.01.

EXAMPLE 6

A silicon dioxide/germanium dioxide mixture thin film was formed on a quartz single crystal substrate by a plasma enhanced CVD process using metal alkoxides as a raw material.

The (001) plane (Z plane) of a quartz single crystal having been mirror polished was used as a substrate. The substrate was retreated by subjecting to ultrasonic cleaning in acetone, dipping in 20% hydrochloric acid, washing with pure water, and drying.

After evacuating a deposition chamber to a high degree of vacuum, the quartz single crystal substrate placed on a susceptor was maintained at 800° C., and $Si(OC_2H_5)_4$ kept at 30° C. and $Ge(OC_2H_5)_4$ kept at 35° C. were introduced into the chamber at a flow rate of 5 sccm and 10 sccm, respectively, together with argon carrier gas. At the same time, 5 sccm of oxygen as an oxidizing gas and 500 sccm of argon as a diluent gas were supplied to the chamber. The pressure in the chamber was maintained at 0.5 Torr.

A radiofrequency voltage of 13.56 MHz (300 W) was applied to opposing circular electrodes placed in parallel to the susceptor to decompose the raw material gas and form a thin film for 2 hours.

Figure 5:
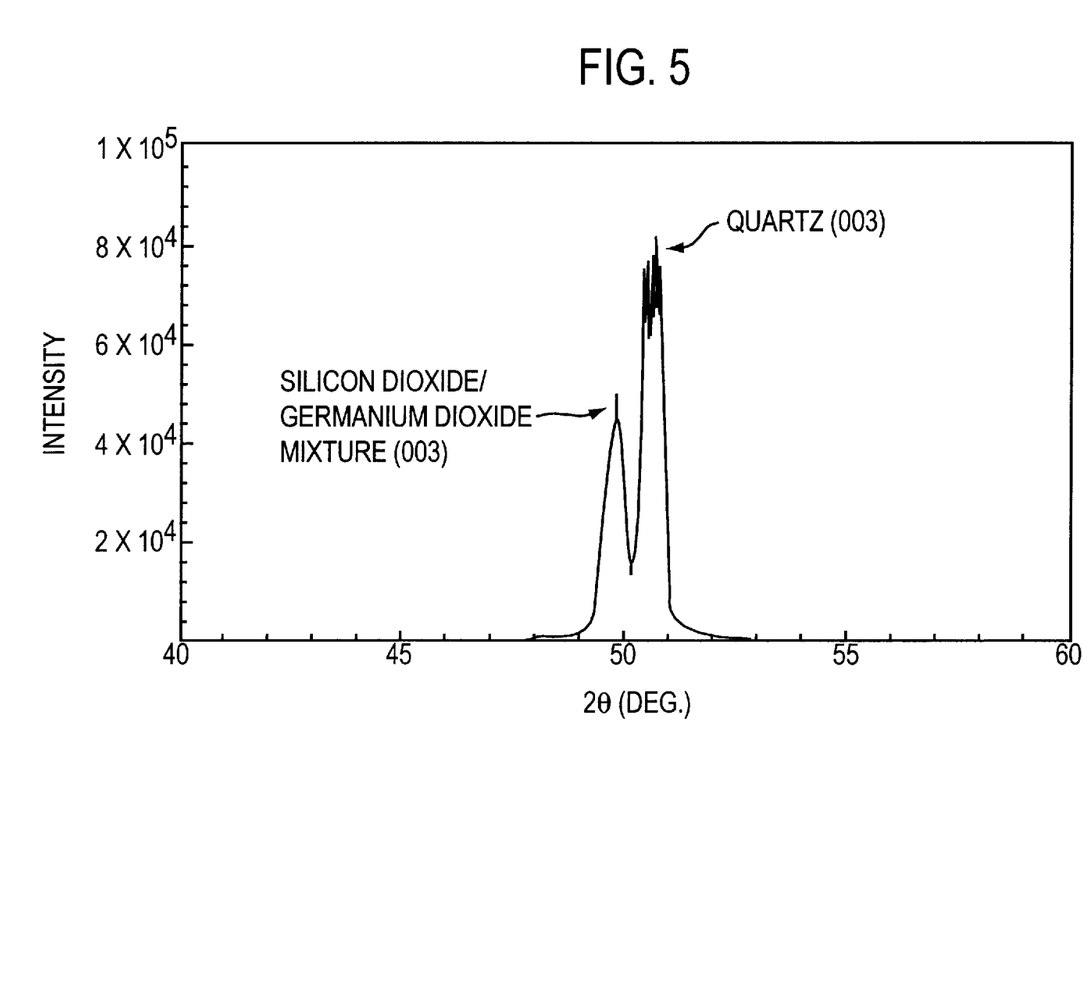
FIG. 5 is an X-ray diffraction pattern in Example 6 showing the peaks of the quartz single crystal substrate (Z plane) and the silicon dioxide/germanium dioxide mixture thin film formed thereon.

The thin film formed on the substrate was analyzed by X-ray diffractometry in the same manner as in Example 1. As shown in FIG. 5, the diffraction pattern showed peaks assigned to the Z plane of the quartz substrate and the Z plane of a silicon dioxide/germanium dioxide mixture having a quartz crystal structure, with no peak of an amorphous component at a low angle ($\leq 20°$). It was revealed that a single crystal thin film of a mixture of silicon dioxide and germanium dioxide having a quartz crystal structure had been formed. The single crystal thin film of the mixed oxide having a quartz crystal structure had a thickness of 0.5 $\mu$m. As a results of electron X-ray fluorometry, the film was found to have an Si/Ge ratio of 1/0.93.

EXAMPLE 7

A silicon dioxide thin film was formed on a silicon single crystal substrate by a sputtering process.

The (100) plane of a silicon single crystal having been mirror polished was used as a substrate. The substrate was retreated by subjecting to ultrasonic cleaning in acetone, dipping in 20% hydrochloric acid, washing with pure water, and drying.

As a target of sputtering, quartz glass having an Li/Si molar ratio of 0.7 mol % was prepared from $Si(OC_2H_5)_4$ and $LiOC_2H_5$ by a sol-gel process.

After evacuating a deposition chamber to a high degree of vacuum, the silicon single crystal substrate placed on a susceptor was maintained at 850° C., and a mixed gas composed of 80 vol % of argon and 20 vol % of oxygen was introduced into the chamber to a pressure of 0.02 Torr. A radiofrequency voltage of 13.56 MHz (300 W) was applied to the target to conduct magnetron sputtering and form a thin film for 1 hour.

The thin film formed on the substrate was analyzed by X-ray diffractometry in the same manner as in Example 1. The diffraction pattern showed a peak assigned to the silicon single crystal substrate and a peak assigned to polycrystalline quartz, indicating the formation of a silicon dioxide polycrystalline thin film having a quartz crystal structure. The thin film had a thickness of 0.3 $\mu$m. The Li/Si molar ratio of the thin film was found to be 0.9 mol %.

EXAMPLE 8

A silicon dioxide thin film having a quartz crystal structure was formed on a sapphire substrate by vacuum evaporation using, as an evaporation material; lithium-containing quartz glass prepared by the same sol-gel process as described in Example 7.

The (001) plane of sapphire having been mirror polished was used as a substrate. The substrate was retreated by subjecting to ultrasonic cleaning in acetone, dipping in 20% hydrochloric acid, washing with pure water, and drying.

Lithium-containing quartz glass was placed on an electron beam evaporation source. After evacuating a deposition chamber to a high degree of vacuum, the sapphire substrate was heated to 950° C. Oxygen was introduced into the chamber as an oxidizing gas to a pressure of $5\times10^{-5}$ Torr, and the lithium-containing quartz glass was heated and evaporated by electron beam irradiation to form a thin film for 30 minutes.

The thin film formed on the substrate was analyzed by X-ray diffractometry in the same manner as in Example 1. The diffraction pattern exhibited a peak assigned to the sapphire substrate and a peak assigned to quartz having a (001) orientation, indicating the formation of a silicon dioxide (001) oriented thin film having a quartz crystal structure. The thin film had a thickness of 0.06 μm.

EXAMPLE 9

A germanium dioxide thin film was formed on a quartz single crystal substrate by a laser ablation process.

The AT plane of single crystal quartz having been mirror polished was used as a substrate. The substrate was retreated by subjecting to ultrasonic cleaning in acetone, dipping in 20% hydrochloric acid, washing with pure water, and drying. As an ablation target, germanium dioxide glass was prepared by a sol-gel process using $Ge(OC_2H_5)_4$ as a raw material.

The quartz single crystal substrate was placed on a susceptor, and the distance between the substrate and the target was set at 5 cm. Oxygen was introduced into the deposition chamber as an oxidizing gas to a pressure of 0.03 Torr, and the quartz single crystal substrate was heated up to 670° C.

A pulse laser beam of an ArF excimer layer (193 nm) was focused on the target through a spherical convex lens to irradiate the target with an excimer laser beam having an energy of 150 mJ per pulse at a rate of 5 pulses per second and form a thin film for 15 minutes.

As a result of X-ray diffractometry on the resulting thin film, a diffraction peak assigned to the AT plane of the quartz substrate and a peak assigned to the AT plane of germanium dioxide having a quartz crystal structure were observed, indicating the formation of a germanium dioxide single crystal thin film having a quartz crystal structure. The thickness of the germanium dioxide film was 1 μm at the maximum.

As having been fully described, the present invention provides an oxide thin film having a quartz crystal structure having an arbitrary thickness between 5 nm and 50 μm at low cost through a sol-gel process which requires no large-scaled equipment or a vapor phase deposition process excellent in controllability.

While the invention has been described in detail and with reference to specific examples thereof, it will be apparent to one skilled in the art that various changes and modifications can be made therein without departing from the spirit and scope thereof.

What is claimed is:

1. An oxide thin film having a quartz crystal structure formed on a substrate, said oxide thin film being composed of a single layer or a plurality of layers having a thickness of 5 nm to 50 μm per layer, each of said layers comprising a mixture of silicon dioxide and germanium dioxide, wherein said thin film contains $3\times10^{-4}$ to 10 mol % of an alkali metal based on the total metal content, the total content of silicon and germanium is not less than 70 mol % based on the total metal content, and the molar ratio of germanium to silicon is from 0.01 to 4.

2. An oxide thin film having a quartz crystal structure as claimed in claim 1, wherein said substrate is a single crystal substrate, and said layer in direct contact with said substrate is a single crystal with each of the other of said layers being a single crystal or having a crystal orientation.

3. An oxide thin film having a quartz crystal structure as claimed in claim 2, wherein said single crystal substrate is a quartz single crystal.

4. An oxide thin film having a quartz crystal structure as claimed in claim 3, wherein said single crystal substrate is an AT plane of said quartz single crystal.

5. An oxide thin film having a quartz crystal structure as claimed in claim 1, wherein said thin film is composed of crystal grains having a grain size of not more than 500 nm.

\* \* \* \* \*